(12) United States Patent
Nakao et al.

(10) Patent No.: US 7,800,575 B2
(45) Date of Patent: Sep. 21, 2010

(54) DISPLAY DEVICE

(75) Inventors: Takayuki Nakao, Atsugi (JP); Hideo Sato, Hitachi (JP); Masahiro Maki, Mobara (JP); Toshio Miyazawa, Chiba (JP)

(73) Assignee: Hitachi Displays, Ltd., Chiba-ken (JP)

( * ) Notice: Subject to any disclaimer, the term of this patent is extended or adjusted under 35 U.S.C. 154(b) by 899 days.

(21) Appl. No.: 11/702,121

(22) Filed: Feb. 5, 2007

(65) Prior Publication Data

US 2007/0194973 A1    Aug. 23, 2007

(30) Foreign Application Priority Data

Feb. 7, 2006    (JP) .............................. 2006-029976

(51) Int. Cl.
G09G 3/36 (2006.01)
H03M 1/12 (2006.01)
G11C 19/00 (2006.01)

(52) U.S. Cl. .................... 345/100; 345/98; 345/99; 341/155; 377/77; 377/78; 377/80; 377/81; 377/67

(58) Field of Classification Search ......... 345/211–213, 345/98–100; 341/155; 377/77–78, 80–81, 377/67
See application file for complete search history.

(56) References Cited

U.S. PATENT DOCUMENTS 4,420,700 A * 12/1983 Fay et al. ................... 327/434
6,690,347 B2 * 2/2004 Jeon et al. ................... 345/100
6,801,194 B2 * 10/2004 Miyazawa et al. .......... 345/204
2003/0128180 A1 * 7/2003 Kim et al. ................... 345/100
2005/0206604 A1 * 9/2005 Washio et al. ................ 345/98

* cited by examiner

Primary Examiner—Sumati Lefkowitz
Assistant Examiner—Jonathan Horner
(74) Attorney, Agent, or Firm—Stites & Harbison PLLC; Juan Carlos A. Marquez, Esq.

(57) ABSTRACT

The present invention provides a display device which includes a drive circuit having a CMOS shift register circuit constituted of a simple CMOS circuit. A drive circuit includes a shift register circuit, and the shift register circuit includes $n (n \geq 2)$ pieces of basic circuits which are connected vertically in multiple stages. The basic circuit includes a first transistor of a first conductive type having a first electrode to which a clock is applied, a second transistor of a second conductive type different from the first conductive type in a conductive type and having a first electrode to which a second power source voltage is applied, and a third transistor of a first conductive type having a second electrode which is connected to the second electrode of the second transistor and a first electrode to which a first power source voltage different from the second power source voltage is applied, wherein the second electrode of the first transistor is connected to a control electrode of the third transistor, an input signal is applied to a control electrode of the first transistor and a control electrode of the second transistor, and a voltage of the second electrode of the third transistor forms a scanning circuit output.

19 Claims, 11 Drawing Sheets

DISPLAY DEVICE

BACKGROUND OF THE INVENTION

1. Field of the Invention

The present invention relates to a display device, and more particularly to a display device which includes a drive circuit having a CMOS shift register circuit which is constituted of a CMOS circuit.

2. Description of the Related Art

In general, in an active matrix liquid crystal display device which uses thin film transistors (TFT: Thin Film Transistor) as active elements, a scanning circuit is used for sequentially applying a selective scanning voltage to scanning lines.

FIG. 13 is a block diagram showing the circuit constitution of a conventional scanning circuit. In the drawing, numeral 10 indicates a shift register circuit and numeral 11 indicates a level shift circuit.

As the shift register circuit 10 shown in FIG. 13, there has been known a CMOS shift register circuit which is constituted of a CMOS (Complementary Metal Oxide Semiconductor) circuit or an nMOS single-channel shift register circuit which is constituted of nMOS single-channel transistor.

FIG. 14 is a circuit diagram showing a unit circuit of the conventional CMOS shift register circuit which adopts the circuit constitution described in JP-A-2000-227784 or JP-A-10-199284.

The unit circuit shown in FIG. 14 includes a clocked inverter (INV1) which inverts an input signal (IN), an inverter (INV2) which re-inverts an inverted signal of the input signal (IN), and a clocked inverter (INV3) which feedbacks are inverted signal of the input signal (IN) to an input of the inverter (INV2).

Then, an output of the inverter (INV2) becomes a transfer output (TRN). Further, the input signal (IN) and the transfer output (TRN) are inputted to a NAND circuit (NAND). An output signal of the NAND circuit (NAND) is inverted by an inverter (INV4) thus generating a scanning circuit output (OT).

Here, the clocked inverter (INV1) in an odd-numbered-stage unit circuit inverts the input signal when a clock (CLK) assumes a High level (inverting clock (CLKB) being at a Low level), and the clocked inverter (INV3) in the unit circuit in the same stage inverts the input signal when the clock (CLK) assumes a Low level ((inverting clock (CLKB) being at a High level).

On the other hand, in the clocked inverter (INV1, INV3) in an even-numbered-stage unit circuit, the relationship with the clock which inverts the input signal is opposite to the relationship with the clock in the odd-numbered-stage unit circuit.

Here, JP-A-2002-215118 discloses the nMOS single-channel shift register circuit which is constituted of the nMOS single-channel transistor.

FIG. 15 is a circuit diagram showing an actual circuit constitution of the unit circuit shown in FIG. 14. An input signal IN(S) in FIG. 15 corresponds to an input signal (IN) in FIG. 14, while a scanning circuit output OT(S) in FIG. 15 corresponds to a scanning circuit output (OT) in FIG. 14.

As shown in FIG. 13, in the conventional scanning circuit, the level shift circuit 11 is provided for every line separately from the shift register circuit 10. Further, FIG. 16 is a circuit diagram showing the circuit constitution of one example of the level shift circuit 11 shown in FIG. 13.

A level conversion circuit shown in FIG. 16 is a so-called cross-type level conversion circuit, wherein a signal (IN(L)) which is a low-voltage signal and an inverted signal (INB(L)) thereof are inputted to the level conversion circuit and signals (OT(L), OTB(L)) which are high-voltage signals are outputted from the level conversion circuit. Here, a signal IN(L) in FIG. 16 corresponds to the scanning circuit output (OT(S)) in FIG. 15.

Recently, the development of high definition is in progress in an active matrix liquid crystal display device which is used in a digital still camera, a mobile phone or the like.

Along with the development of high definition, in a conventional scanning circuit, as shown in FIG. 15 and FIG. 16, the number of transistor elements is increased (the unit circuit of the shift register circuit 10 having 16 transistor elements and the unit circuit of the level shift circuit 11 having 6 transistor elements) in the conventional scanning circuit thus giving rise to a drawback that the achievement of high definition is difficult.

Further, p-type MOS transistors (PM1, PM2) and n-type MOS transistors (NM1, NM2) shown in FIG. 15 are configured such that a gate is directly connected to a clock bus through which a clock (CLK) and an inverted clock (CLKB) are transmitted and hence, a load of the clock bus is increased thus giving rise to a drawback that the power consumption is increased.

Further, the p-type MOS transistors (PM1, PM2) and the n-type MOS transistors (NM1, NM2) shown in FIG. 15 are operated for every clock and hence, the transistor is remarkably deteriorated thus giving rise to a drawback with respect to the reliability thereof in a high speed operation.

On the other hand, recently, to cope with a demand for low power consumption and hence, it is necessary to lower amplitude of the clock which consumes the power most. However, here exists a drawback that the conventional circuit constitution cannot lower the amplitude of the clock.

Further, for example, although the nMOS single-channel shift register circuit which is described in the previously-mentioned JP-A-2002-215118 realizes the low input capacitance and the high reliability, the shift register circuit has a drawback that the reduction of voltage and the high-speed driving are difficult.

The present invention has been made to overcome the above-mentioned drawbacks of the related art and it is an object of the present invention to provide a display device which includes a drive circuit having a CMOS shift register circuit which is constituted of a simple CMOS circuit.

The above-mentioned and other objects of the present invention and novel features of the present invention will become apparent from the description of this specification and attached drawings.

SUMMARY OF THE INVENTION

To explain the summary of typical invention among inventions disclosed in this specification, it is as follows.

A display device includes a plurality of pixels and a drive circuit which drives the plurality of pixels. The drive circuit includes a shift register circuit, and the shift register circuit includes n(n≧2) pieces of basic circuits which are connected vertically in multiple stages. The basic circuit includes a first transistor of a first conductive type having a first electrode to which a clock is applied, a second transistor of a second conductive type different from the first conductive type in a conductive type and having a first electrode to which a second power source voltage is applied, and a third transistor of a first conductive type having a second electrode which is connected to the second electrode of the second transistor and a first electrode to which a first power source voltage different from the second power source voltage is applied, wherein the second electrode of the first transistor is connected to a control electrode of the third transistor, an input signal is applied to a control electrode of the first transistor and a control electrode of the second transistor, and a voltage of the second electrode of the third transistor forms a scanning circuit output.

To briefly explain advantageous effects obtained by the typical invention among inventions disclosed in this specification, they are as follows.

According to the present invention, it is possible to provide the display device provided with the drive circuit having the CMOS shift register circuit which is constituted of a simple CMOS circuit.

DESCRIPTION OF THE PREFERRED EMBODIMENTS

Hereinafter, embodiments of the present invention are explained in detail in conjunction with drawings.

Here, in all drawings for explaining the embodiments, parts having identical functions are given same symbols and their repeated explanation is omitted.

Figure 1:
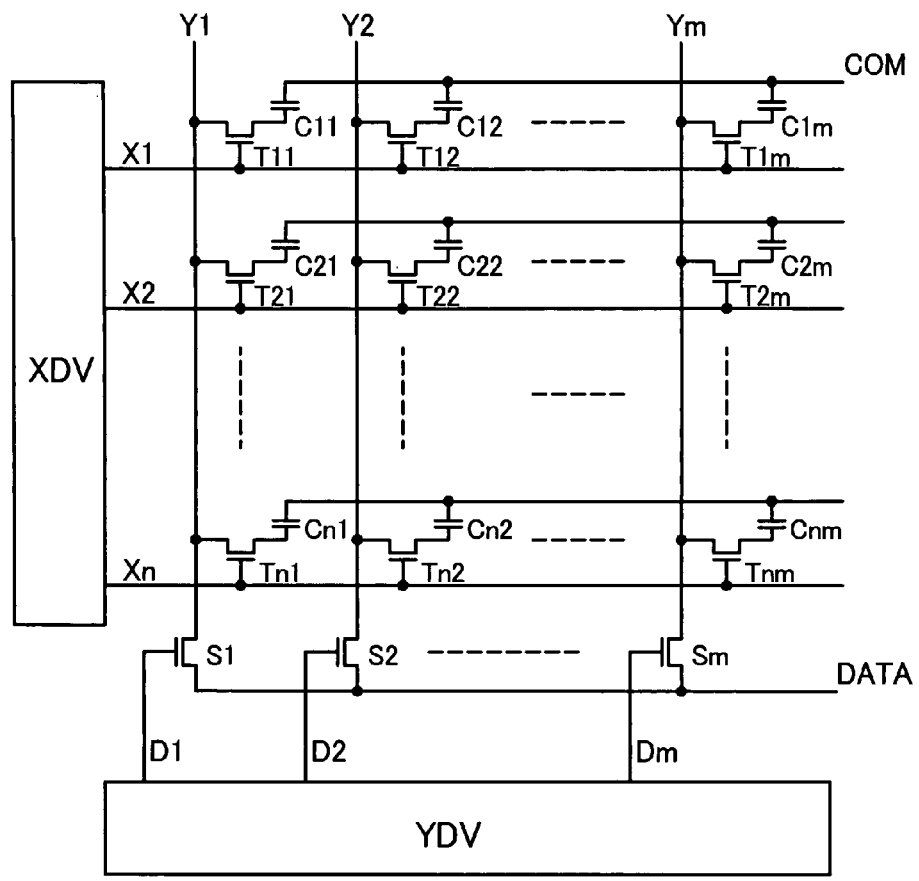
FIG. 1 is a circuit diagram showing an equivalent circuit of an active matrix type liquid crystal display device of an embodiment of the present invention.

FIG. 1 is a circuit diagram showing an equivalent circuit of an active matrix type liquid crystal display device of an embodiment of the present invention.

As shown in FIG. 1, the active matrix type liquid crystal display device of the embodiment includes, on a liquid crystal surface of one of a pair of substrates which are arranged to face each other with a liquid crystal therebetween, n pieces of scanning lines (X1, X2, . . . Xn) which extend in the x direction and m pieces of video lines (Y1, Y2, . . . Ym) which extend in the y direction.

Regions which are surrounded by the scanning lines (also referred to as gate lines) and the video lines (also referred to as drain lines) constitute pixel regions. Each pixel region is provided with a thin film transistor (Tnm) which has a gate thereof connected to the scanning line, a drain (or a source) thereof connected to the video line, and a source (or a drain) thereof connected to a pixel electrode.

Further, a common electrode (also referred to as a counter electrode) (COM) is arranged to face the pixel electrode in an opposed manner and hence, a liquid crystal capacitance (Cnm) is formed between the pixel electrode and the common electrode (COM). Due to an electric field generated between the pixel electrode and the common electrode (COM), liquid crystal (LC) is driven. Here, the common electrodes (ITO) may be formed on the same substrate on which the pixel electrodes are formed or may be formed on the substrate which differs from the substrate on which the pixel electrodes are formed. Here, a holding capacitance is formed between a holding capacitance line and the pixel electrode.

The respective scanning lines (X1, X2, . . . Xn) are connected to a vertical drive circuit (XDV) and sequentially supply a gate signal toward the scanning lines X1 to Xn by the vertical drive circuit (XDV) (referred to as "forward direction scanning). Alternatively, the respective scanning lines (X1, X2, . . . Xn) sequentially supply the gate signal toward the scanning lines Xn to X1 by the vertical drive circuit (XDV) (referred to as "backward direction scanning).

The respective video lines (Y1, Y2, . . . Ym) are connected to drains (or sources) of switching elements (S1, S2, . . . Sm).

The switching elements (S1, S2, . . . Sm) have sources (or drains) thereof connected to video signal lines (DATA) and have gates thereof connected to a horizontal drive circuit (YDV).

By a horizontal drive circuit (YDV), scanning is sequentially performed toward the switching elements from S1 to Sm (referred to as "forward direction scanning). Alternatively, by the horizontal drive circuit (YDV), scanning is sequentially performed toward the switching elements from Sm to S1 (referred to as "reverse direction scanning).

Figure 2:
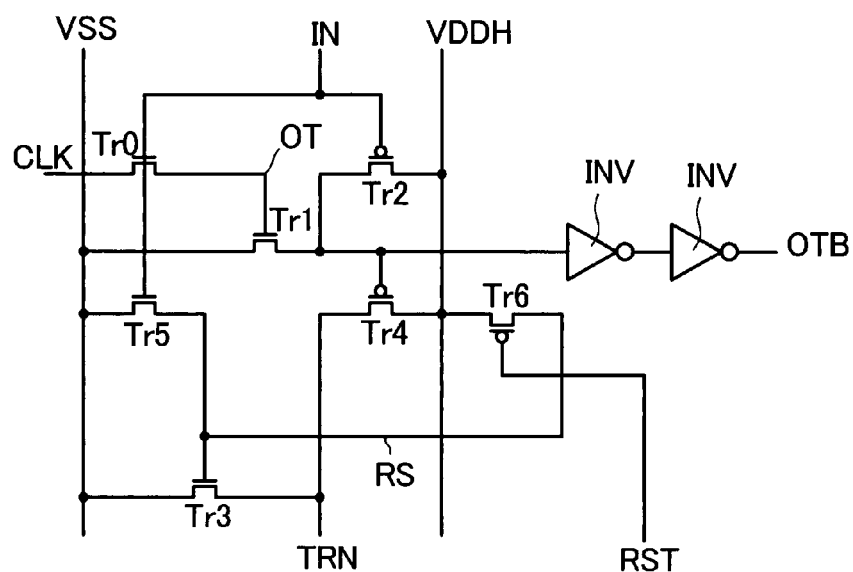
FIG. 2 is a circuit diagram for explaining a basic circuit of a CMOS shift register circuit of the embodiment of the present invention.

FIG. 2 is a circuit diagram for explaining a basic circuit of the CMOS shift register circuit of this embodiment of the present invention, and also is a circuit diagram for explaining a basic circuit of the CMOS shift register circuit which is applied to the vertical drive circuit (XDV) and the horizontal drive circuit (YDV) shown in FIG. 1.

The CMOS shift register circuit of this embodiment adopts a circuit which is constituted of seven transistors consisting of p-type MOS transistors (Tr2, Tr4, Tr6) and n-type MOS transistors (Tr0, Tr1, Tr3, Tr5) shown in FIG. 2 as the basic circuit.

These seven transistors (Tr0 to Tr6) are formed of a thin film transistor which uses poly-silicon as a material of the semiconductor layer.

Further, the vertical drive circuit (XDV) and the horizontal drive circuit (YDV) in FIG. 1 are circuits arranged in the inside of the liquid crystal display panel. These circuits are, in the same manner as the seven transistors (Tt0 to Tr6), formed of a thin film transistor which uses poly-silicon as the semiconductor layer, wherein these thin film transistors are formed simultaneously with the formation of the thin film transistors of the pixels (Tnm) and the like.

In FIG. 2, a second power source voltage (VDDH) is set as a High level (hereinafter referred to as an H level) and a first power source voltage (VSS) is set as a Low level (hereinafter referred to as an L level).

A drain of the p-type MOS transistor (Tr2) and a drain of the n-type MOS transistor (Tr1) are connected to each other, a source of the p-type MOS transistor (Tr2) is connected to the second power source voltage (VDDH), and a source of the n-type MOS transistor (Tr1) is connected to the first power source voltage (VSS).

In the same manner, a drain of the p-type MOS transistor (Tr4) and a drain of then type MOS transistor (Tr3) are connected to each other, a source of the p-type MOS transistor (Tr4) is connected to the second power source voltage (VDDH), and a source of the n-type MOS transistor (Tr3) is connected to the first power source voltage (VSS).

Further, a drain of the p-type MOS transistor (Tr6) and a drain of the n-type MOS transistor (Tr5) are connected to each other, a source of the p-type MOS transistor (Tr6) is connected to the second power source voltage (VDDH), and a source of the n-type MOS transistor (Tr5) is connected to the first power source voltage (VSS).

A clock (CLK) is applied to a source of the n-type MOS transistor (Tr0), and a drain of the n-type MOS transistor (Tr0) is connected to the gate of the n-type MOS transistor (Tr1).

An input signal (IN) is applied to a gate of the n-type MOS transistor (Tr0) and a gate of the n-type MOS transistor (Tr5). Further, the input signal (IN) is also applied to a gate of the p-type MOS transistor (Tr2).

A drain of the n-type MOS transistor (Tr5) (or a drain of the p-type MOS transistor (Tr6)) is connected to the gate of the n-type MOS transistor (Tr3).

A drain of the n-type MOS transistor (Tr1) (or a drain of the p-type MOS transistor (Tr2)) is connected to the gate of the p-type MOS transistor (Tr4), and a drain voltage of the n-type MOS transistor (Tr1) becomes a scanning circuit output (OTB).

A voltage at the drain of the n-type MOS transistor (Tr3) (or a voltage at the drain of the p-type MOS transistor (Tr4)) becomes a transfer output (TRN). Further, a reset signal (RST) is applied to the gate of the p-type MOS transistor (Tr6).

In a steady state, the input signal (IN) assumes an L level and a reset signal (RST) assume an H level. Further, a node (OT) assumes an L level in a floating state, while a node (RS) assumes a H level in a floating state. Here, a scanning circuit output (OTB) assumes an H level and the transfer output (TRN) assumes an L level.

In such a steady state, the transistors (Tr0, Tr1, Tr4, Tr5, Tr6) are turned off, and the transistors (Tr2, Tr3) are turned on.

Figure 3:
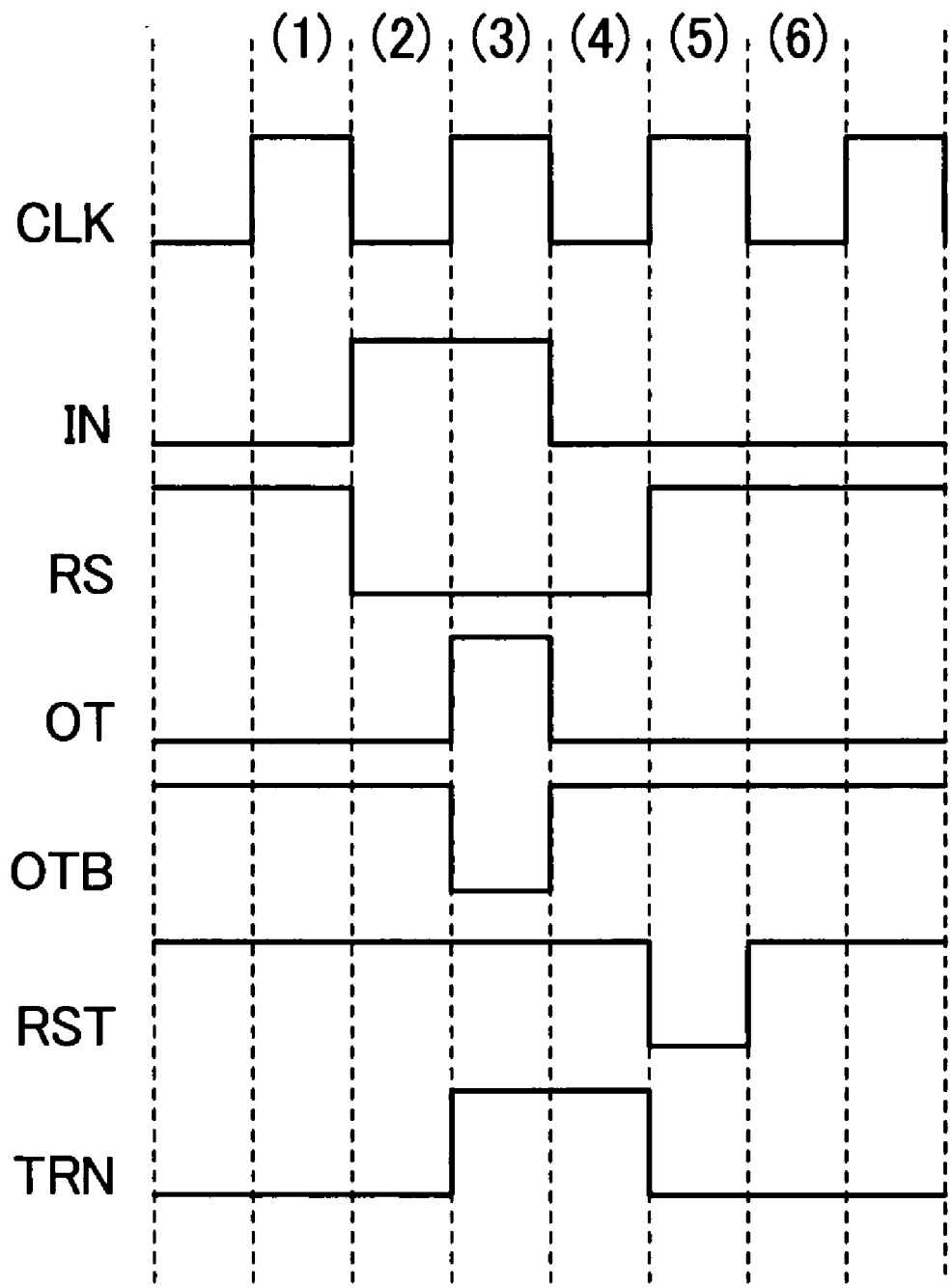
FIG. 3 is a view for explaining timings of a clock (CLK) and an input signal (IN) which are inputted to the basic circuit shown in FIG. 2.

To the basic circuit shown in FIG. 2, the clock (CLK) and the input signal (IN) are inputted at timings shown in FIG. 3.

At the timing of (1)→(2) in FIG. 3, when the input signal (IN) assumes the H level from the L level, the transistor (Tr0) and the transistor (Tr5) are turned on, and the transistor (Tr2) is turned off.

At the timing (2) shown in FIG. 3, since the clock (CLK) assumes an L level, a potential of the node (OT) is not changed and is held at the L level, while the scanning circuit output (OTB) assumes a floating state and holds the H level.

Further, the transistor (Tr5) is turned on and hence, the node (RS) assumes an L level, and the transistor (Tr3) is turned off. Since the transistor (Tr3) and the transistor (Tr4) are turned off, the transfer output (TRN) assumes a floating state and is held at the L level.

At the timing (3) in FIG. 3, when the clock (CLK) assumes the H level from the L level, a potential of the node (OT) assumes the H level and the transistor (Tr1) is turned on. Accordingly, the scanning circuit output (OTB) assumes the L level and hence, the transistor (Tr4) is turned on and the transfer output (TRN) assumes the H level.

At the timing (4) in FIG. 3, when the input signal (IN) and the clock (CLK) assume the L level from the H level, the transistors (Tr0, Tr1, Tr5) are turned off, and the transistor (Tr2) is turned on and hence, the node (OT) assumes an L level holding state and the scanning circuit output (OTB) assumes the H level. Further, the transistor (Tr4) is turned off and the transfer output (TRN) is held at the H level.

At the timing (5) in FIG. 3, when the reset signal (RST) assumes the L level from the H level, the transistor (Tr6) is turned on and the node (RS) assumes the H level. Accordingly, the transistor (Tr3) is turned on and the transfer output (TRN) assumes the L level.

At the timing (6) in FIG. 3, when the reset signal (RTS) assumes the H level from the L level, the transistor (Tr6) is turned off and hence, the node (RS) assumes a floating state in which the H level is held and, thereafter, the node (RS) assumes a steady state again.

The above explains the basic operation of the basic circuit, wherein as the transfer output (TRN), the input signal (IN) is transferred by shifting by one clock and, at the same time, the transfer output (TRN) can be outputted by latching the clock (CLK) at the timing of the input signal (IN).

Figure 4:
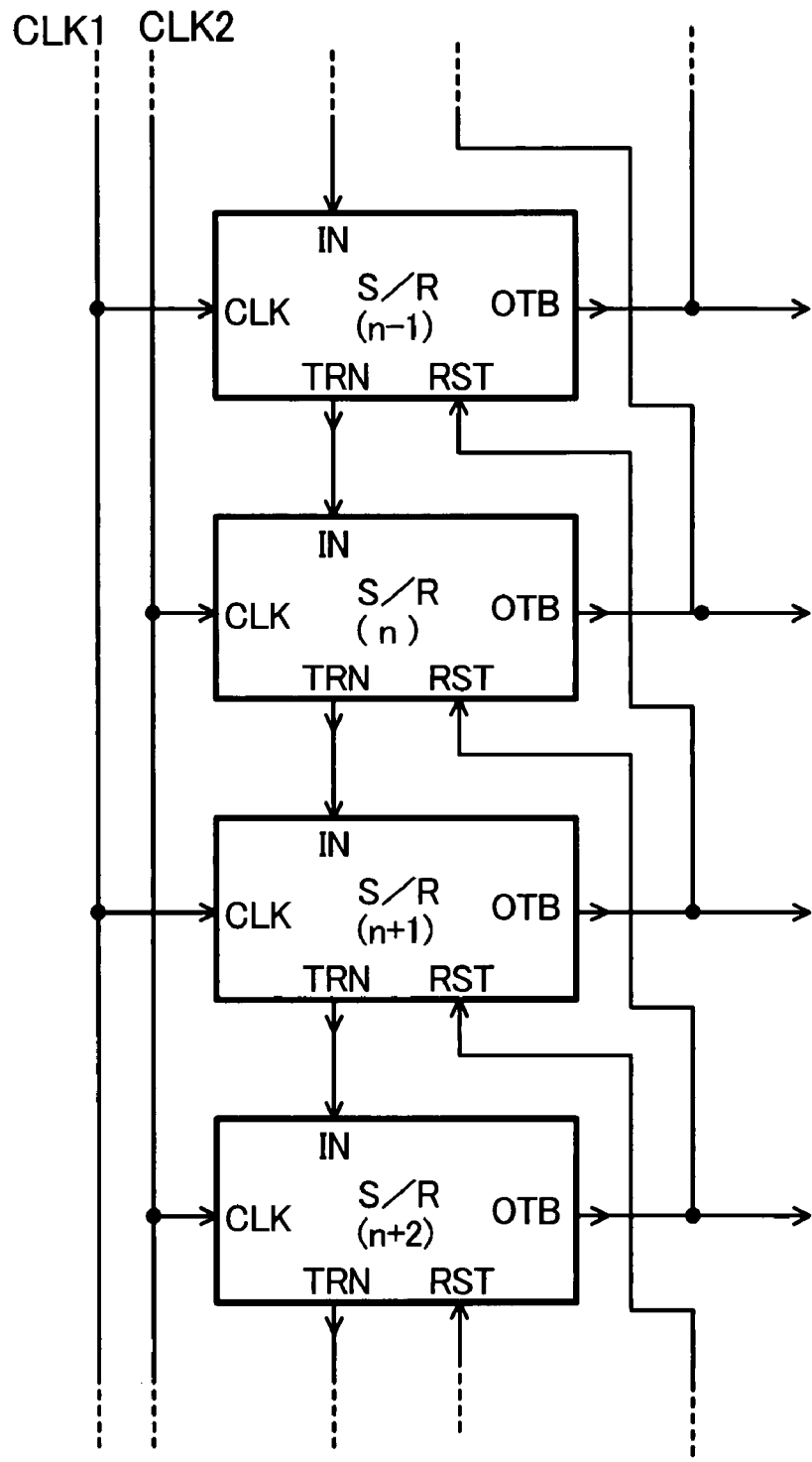
FIG. 4 is a view showing a scanning circuit of the embodiment of the present invention.

As shown in FIG. 4, n pieces of the above-mentioned basic circuits (S/R) are connected in multiple stages, wherein by inputting clocks (CLK1, CLK2) having phases opposite to each other to the CLK terminals of the odd-numbered basic circuits (SIR) and the CLK terminals of the even-numbered basic circuits (S/R), the clock can be sequentially transferred and hence, the basic circuits (S/R) can obtain a function of the scanning circuit (shift register circuit).

In the basic circuit shown in FIG. 2, at the time of changing over of the input signal (IN) from the L level to the H level, when the input signal (IN) rises in a state that the clock (CLK) assumes the H-level state, there exists a possibility that the scanning circuit output (OTB) assumes the L level at the different timing.

Further, at the time of changing over of the input signal (IN) from the H level to the L level, when the input signal (IN) falls in a state that the clock (CLK) assumes the H level, the node (OT) is held at the H level and hence, the second power source voltage (VDDH) and the first power source voltage (VSS) are connected to each other via the transistor (Tr2) and the transistor (Tr1) thus allowing a through current to pass therethrough. Accordingly, it is necessary to delay both of the rise and the fall of the input signal (IN) with respect to the fall of the clock (CLK).

As shown in FIG. 4, the input signal (IN) is the transfer output (TRN) of the preceding stage. The transfer output (TRN) assumes the H level when the transistor (Tr1) is turned on with the clock (CLK) and, thereafter, the transistor (Tr4) is turned on. Further, when the scanning circuit output (OTB) of the next-to-next scanning circuit output (OTB) is inputted to the reset signal (RST) and the transistor (Tr3) is turned on, the transfer output (TRN) assumes the L level.

That is, both of the timing at which the input signal (IN) (the transfer output (TRN) of the preceding stage) assumes the H level from the L level and the timing at which the input signal (IN) (the transfer output (TRN) of the preceding stage)

assumes the L level from the H level are delayed by an amount corresponding to the operation of the transistor with respect to the changeover timing of the clock (CLK).

Accordingly, it is considered that the above-mentioned condition which delays both of the rise and the fall of the input signal (IN) with respect to the fall of the clock (CLK) is satisfied. However, with respect to the start signal (FLM) which is the input signal (IN) of the initial stage, it is considered necessary to perform the adjustment such as delaying of the start signal (FLM).

Figure 15:
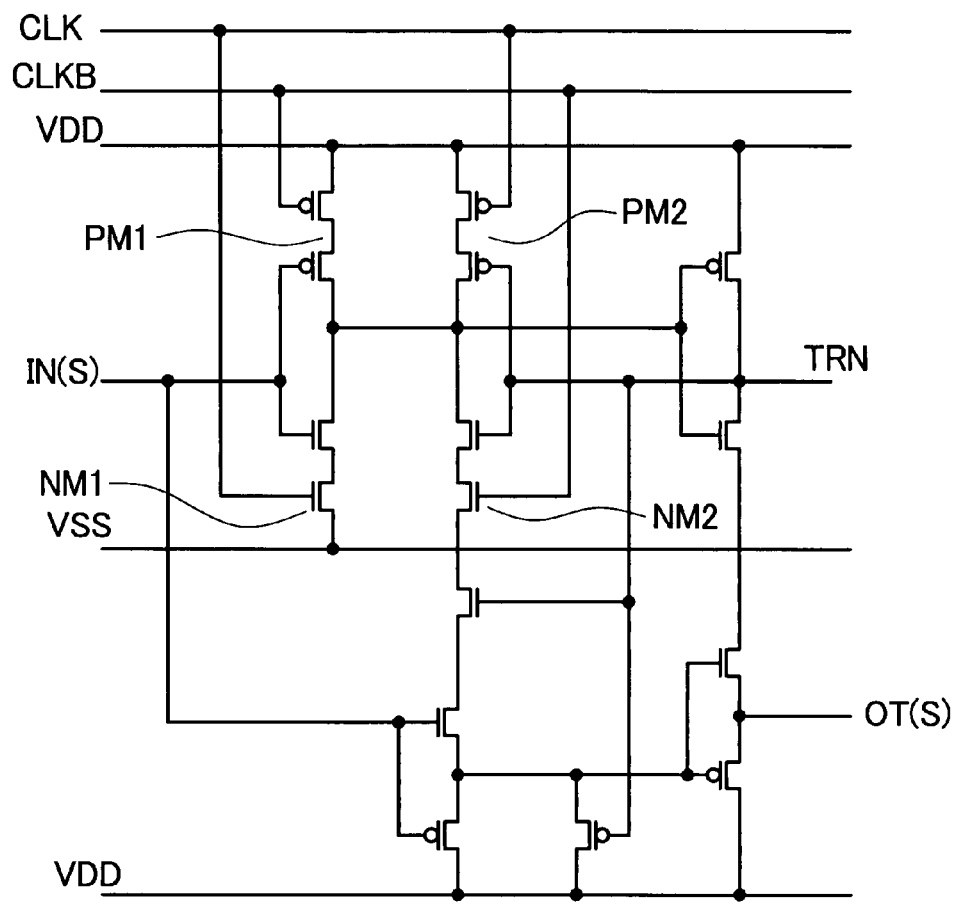
FIG. 15 is a circuit diagram showing the actual circuit constitution of the unit circuit shown in FIG. 14.
Figure 16:
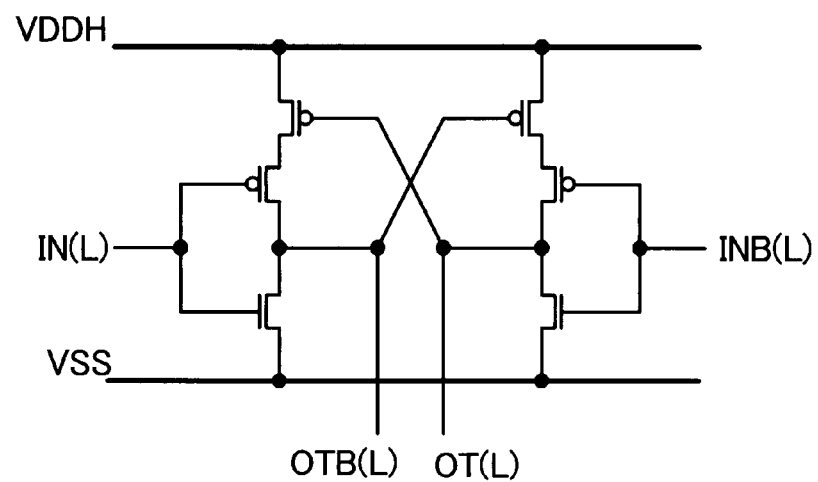
FIG. 16 is a circuit diagram showing the circuit constitution of one example of a level shift circuit shown in FIG. 13.

In case of the circuit constitution shown in FIG. 15, the p-type MOS transistors (PM1, PM2) and the n-type MOS transistors (NM1, NM2) have gates thereof directly connected to a clock bus through which the clock (CLK) and the inverted clock (CLKB) are transferred.

That is, in case of the circuit constitution shown in FIG. 15, gate capacitances of all transistors which are connected to the clock bus constitute the load capacitance of the input clock.

On the other hand, in the basic circuit of this embodiment shown in FIG. 2, what is connected to the clock bus through which the clock (CLK) is transmitted is the drain (or the source) of the transistor (Tr0) and hence, the load capacitance of the input clock becomes a gate-off capacitance in stages except for the active stages whereby the gate capacitance which becomes the load capacitance is extremely small.

In general, to drive the lines of higher load in a stable manner, it is necessary to increase a steady-state current and hence, the power consumption is increased. However, by adopting the constitution of the basic circuit of this embodiment, the load of the clock bus can be reduced and hence, it is possible to realize the reduction of power consumption for charging and discharging the clock bus and the reduction of power consumption attributed to the reduction of the load of the circuit which drives the clock bus.

Further, as in the case of the circuit constitution shown in FIG. 15, the transistors (PM1, PM2, NM1, NM2) in which the gate is connected to the clock bus perform the switching operation at a cycle of the clock (CLK). The cycle of the clock (CLK) is several times as fast as an operation cycle of the scanning circuit (the shift register circuit) and hence, it is possible to perform the operation several times during a period in which other transistor performs one operation.

In the basic circuit of this embodiment shown in FIG. 2, all transistors are operated at an operation cycle of the scanning circuit and hence, it is possible to enhance the reliability compared to the circuit constitution shown in FIG. 15.

In the circuit constitution shown in FIG. 15, transistors in series connection exist in a transfer part, a NAND circuit (NAND) and the like. When the transistors are connected in series, usually, the ON resistance is increased compared to the single transistor and hence, the driving ability is reduced.

In the basic circuit of this embodiment shown in FIG. 2, no NAND circuit is necessary and the transistors which are connected in series are not present and hence, it is possible to realize the high-speed operation (resulting in the lowering of voltage).

In general, a through current flows in a transition state in which a potential is changed over as in the case of the inverter or the like. This brings about the increase of power consumption.

In the basic circuit of this embodiment shown in FIG. 2, the transistor (Tr1) and the transistor (Tr2), the transistor (Tr3) and the transistor (Tr4), and the transistor (Tr5) and the transistor (Tr6) are respectively considered as paths through which a through current flows.

However, in the basic circuit of this embodiment shown in FIG. 2, a transition state in which ON and OFF states of the transistors are changed over simultaneously does not exist and the transistors are surely changed over with a delay of one clock or an amount corresponding to the delay of operation and hence, the through current hardly flows in the transistors thus achieving the reduction of the power consumption.

In the basic circuit of this embodiment shown in FIG. 2, the clock (CLK) is connected only to the transistor (Tr1) of the n-type MOS transistor via the transistor (Tr0) and hence, the clock (CLK) performs a role of turning on or off the transistor (Tr1).

That is, it is sufficient for the H level of the clock (CLK) to turn on the transistor (Tr1) and hence, the clock (CLK) is not connected to the p-type MOS transistor whereby it is possible to set another potential of H level different from a potential of the second power source voltage (VDDH).

Assuming the amplitude of the clock (CLK) as $Vck (>0)$, a potential difference between the second power source voltage (VDDH) and the first power source voltage (VSS) as $Vh (>0)$, it may be sufficient that relationships $Vck \geq Vthn$, $Vh \geq 2 \times Vthn$ are satisfied. Here, $Vthn (>0)$ is a threshold voltage of the transistor (Tr1).

The above-mentioned explanation suggests that the H level potential of the clock (CLK) having the lower amplitude can be directly boosted to the further higher potential of VDDH, that is, the relationship $Vck \geq Vh$ can be obtained. This implies that the basic circuit of this embodiment possesses the level shift function.

In general, it is possible to enhance the operational performance and the circuit drive ability of the transistor by increasing the power source voltage.

In the constitution shown in FIG. 15, it is basically necessary to set the H levels of the second power source voltage (VDDH) and the clock (CLK) or the L levels of the first power source voltage (VSS) and the clock (CLK) to the same potential respectively. Accordingly, when the power source voltage is increased, the amplitude of the clock (CLK) is also increased.

Since the power consumption in charging or discharging the capacitance is proportional to the square of the voltage and hence, the increase of the amplitude of the clock (CLK), that is, the elevation of the power source voltage leads to the increase of the power consumption.

In the shift register circuit, the power is mainly consumed by charging and discharging of the clock bus capacitance. In the basic circuit of this embodiment shown in FIG. 2, the power source voltage of the shift register circuit can be increased without increasing the amplitude of the clock (CLK) and, at the same time, the charging and discharging with high voltage is performed only for one stage of the basic circuit and hence, the charging and discharging is extremely trivial thus enabling the suppression of the elevation of the power consumption.

Figure 13:
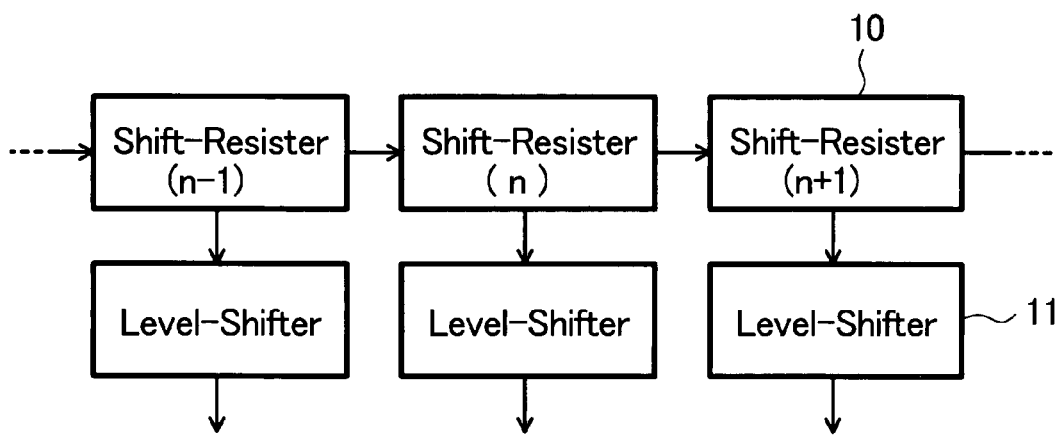
FIG. 13 is a block diagram showing the circuit constitution of a conventional scanning circuit.
Figure 14:
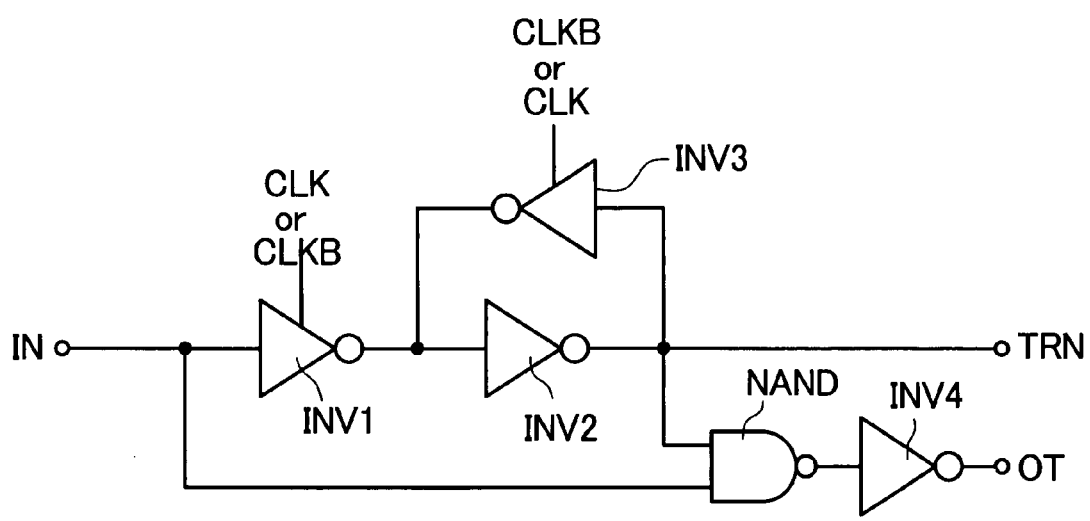
FIG. 14 is a circuit diagram showing a unit circuit of a conventional CMOS shift register circuit.

In the shift register circuit, to increase the output voltage by preventing the increase of the power consumption attributed to the increase of the amplitude of the clock (CLK), as shown in FIG. 13, a level shifter circuit is additionally provided in general.

To the contrary, in the basic circuit of this embodiment shown in FIG. 2, it is possible to omit the level shifter circuit on the H level side and hence, it is possible to reduce the number of elements of the transistor and the consumption current attributed to the operation of the transistor.

As shown in FIG. 4, to the reset signal (RST), the output of the basic circuit of the next-to-next stage is inputted. Accordingly, in last two stages of the scanning circuit, the signal which is inputted to the reset signal (RST) does not exist. That is, since the node (RS) does not assume the H level, the transferred output (TRN) is held at the H level.

In the final stage, a circuit which is connected to the transfer output (TRN) does not exist and hence, the transistors (Tr3 to Tr6) are unnecessary whereby there arises no problem even when the transistors (Tr3 to Tr6) are removed. The reset signal (RST) is also unnecessary.

However, in the stage prior to the final stage by one stage, when the reset signal is not inputted to the reset signal (RST), the transfer output (TRN), that is, the input signal (IN) of the final stage is held at the H level and hence, the clock (CLK) is continuously fetched.

In this case, since the transistor (Tr2) is not turned on, the scanning circuit output (OTB) of the final stage is held at the L level, and the L level is continuously inputted to the reset signal (RST) of the stage prior to the final stage by two stages.

However, since the node (RS) assumes the H level in a steady state, there arises no problem by using the final stage as a dummy stage without using the final stage for scanning circuit outputting.

By inputting an inverted signal (FLMB) of the start signal to the reset signal (RST) prior to the final stage by one stage, the node (RS) assumes the H level at the time of inputting thus bringing about a steady state. It is needless to say that there arises no problem even when a reset clock is additionally provided and inputted.

When a large load is connected to the output node from which the scanning circuit output (OTB) is outputted, it is considered that the delay in the rise or the fall of the output node is increased.

In the basic circuit of this embodiment shown in FIG. 2, the fall of the output node attributed to the transistor (Tr1) largely influences the operational function and hence, the increase of the load of the output node is considered to bring about the lowering of the operational performance of the shift register circuit.

Accordingly, it is effective to increase the transistor performance of the transistor (Tr1) or to provide a buffer such as an inverter (INV) shown in FIG. 2 to reduce the load of the output node.

The node (OT) and the node (RS) are floating nodes and hence, although these nodes respectively assume the L level and the H level in a steady state, these nodes are unstable in an initial state (at the time of supplying the power source).

Figure 5:
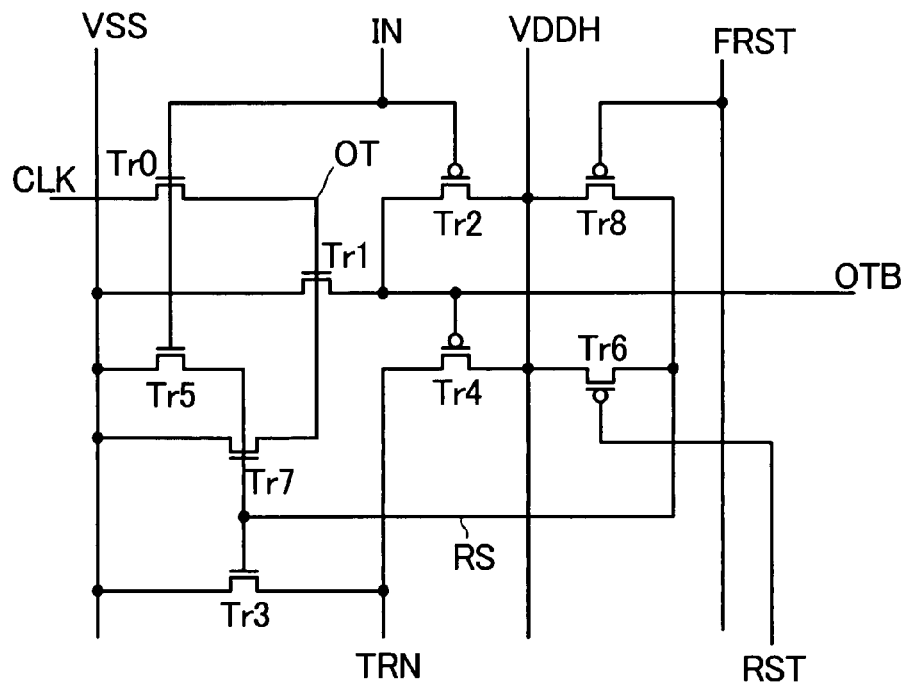
FIG. 5 is a circuit diagram showing a modification of the basic circuit shown in FIG. 2.

Accordingly, as shown in FIG. 5, by providing an n-type MOS transistor (Tr7) which has a source to which the first power source voltage (VSS) is applied, a drain which is connected to the gate of the transistor (Tr1), and a gate which is connected to the gate of the transistor (Tr3), and a p-type MOS transistor (Tr8) which has a source to which the second power source voltage (VDDH) is applied and a drain which is connected to a drain of the transistor (Tr6), by connecting the gate of the transistor (Tr7) to the node (RS), and by applying an initialization clock (FRST) to the gate of the transistor (Tr8), the initialization clock (FRST) assumes the L level, the node (RS) is reset to the H level in a steady state and, at the same time, the node (OT) can be set to the L level in a steady state.

Further, when FLMB which is the inverted signal of the start signal of the scanning circuit is used as the initialization clock (FRST), the initialization can be performed simultaneously with the inputting of the start signal. However, in the transistor (Tr8), the first stage and the second stage are excluded to changeover the node (RS) to the L level during a period in which the inverted start signal (FLMB) assumes the L level.

When the input signal (IN) assumes the L level from the H level, the node (OT) is considered to assume a holding state with a potential lower than the L level due to the capacitive coupling attributed to the gate capacitance of the transistor (Tr0). However, when the holding potential becomes higher than the threshold voltage of the transistor (Tr1) in a steady state, a through current flows through the transistor (Tr2) and the transistor (Tr1). Accordingly, the provision of the transistor (Tr7) is effective to enhance the stability of the circuit.

Further, in the final stage, the clock (CLK) is continuously fetched into the node (OT) until the reset clock such as the inverted start signal (FLMB) is inputted to the reset signal (RST) of the preceding stage after the input signal (IN) assumes the H level. However, depending on the timing of the reset clock, there exists a possibility that the input signal (IN) assumes the L level while fetching the clock (CLK) of H level into the node (OT). In this case, the through current flows in the above-mentioned manner.

Accordingly, to prevent such a through current, it is necessary to perform the timing adjustment of the reset clock or to bring the clock (CLK) into the L level after latching the clock (CLK) in the final stage or to mount the previously mentioned transistor (Tr7).

In a steady state, the node (RS) assumes a floating state and holds the H level. However, when a leaking current such as an OFF current of the transistor exists, the node (RS) cannot maintain the H level.

In the node (RS), as a main leak path, a path to the first power source voltage (VSS) via the transistor (Tr5) is considered and hence, when a potential of the node (RS) becomes lower than a threshold voltage of the transistor (Tr3), there exists a possibility of an erroneous operation.

Figure 6:
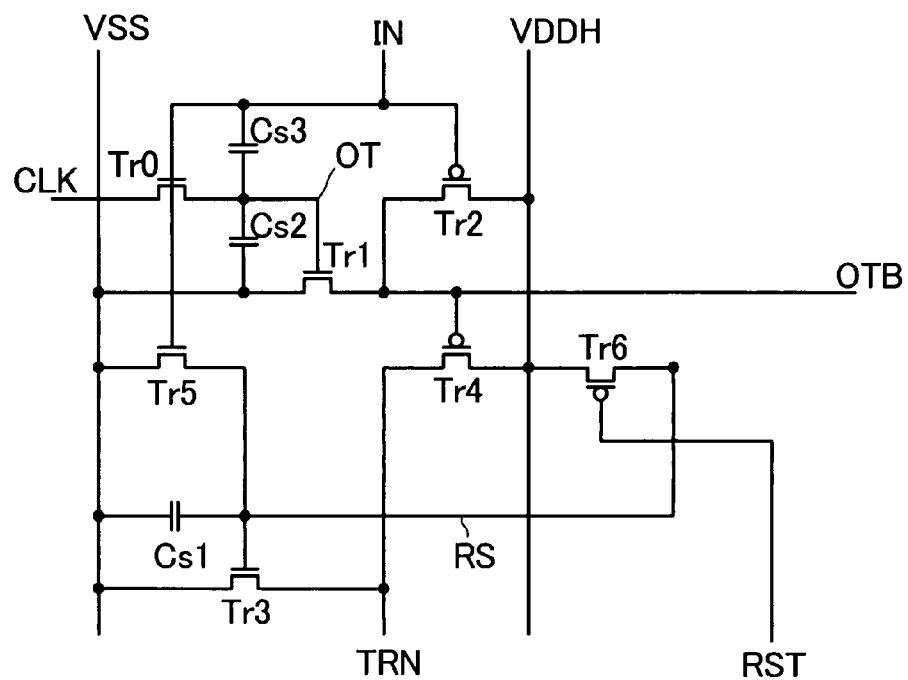
FIG. 6 is circuit diagram showing a modification of the basic circuit shown in FIG. 2.

Accordingly, by adding a holding capacitance (Cs1) to the node (RS) as shown in FIG. 6, it is possible to stabilize the node (RS). It is needless to say that even when the holding capacitance (Cs1) is connected to the second power source voltage (VDDH) or other stable potential, there arises no drawback.

Further, it is also, as a matter of course, effective to elongate a channel length of the transistor (Tr5) or to shorten a channel width of the transistor (Tr5) for reducing a leak current of the transistor (Tr5) which constitutes the maim leak path.

The node (OT) assumes a floating state in a steady state and is liable to be easily influenced by the capacitive coupling and hence, also by providing the holding capacitance (Cs2) to the node (OT) in the same manner as the node (RS), it is possible to increase the stability of the node (OT).

When the node (OT) is changed over from the L level to the H level, the input node of the input signal (IN) (the output node of the transfer output (TRN)) assumes the H level in a floating state. Accordingly, it is considered that the input node of the input signal (IN) may become higher than the H level due to the capacitive coupling.

This elevation of the potential is determined based on a ratio between the load capacitance of the input signal (IN) (gate capacitance of the transistor (Tr2) or the like) and the gate capacitance of the transistor (Tr1) and the amplitude of the clock (CLK). By making use of this effect, the transistor (Tr0) can obtain the higher gate potential and hence, the node (OT) can effectively fetch the clock (CLK).

Accordingly, it is considered that the above-mentioned effect can be further increased by providing the holding capacitance (Cs3) in FIG. 6 and such a constitution is effective when the potential difference between Vck and Vh is small.

However, as mentioned previously, the node (OT) is liable to be easily influenced by the changeover of the potential of the input signal (IN) and hence, the provision of the holding capacitance (Cs3) may increase such an influence. Accordingly, it is necessary to adjust the potential of the node (OT) using the holding capacitance (Cs2) or the like to prevent the potential of the node (OT) from exceeding the threshold voltage of the transistor (Tr1) due to the capacitive coupling when the input signal (IN) assumes the H level.

Figure 7:
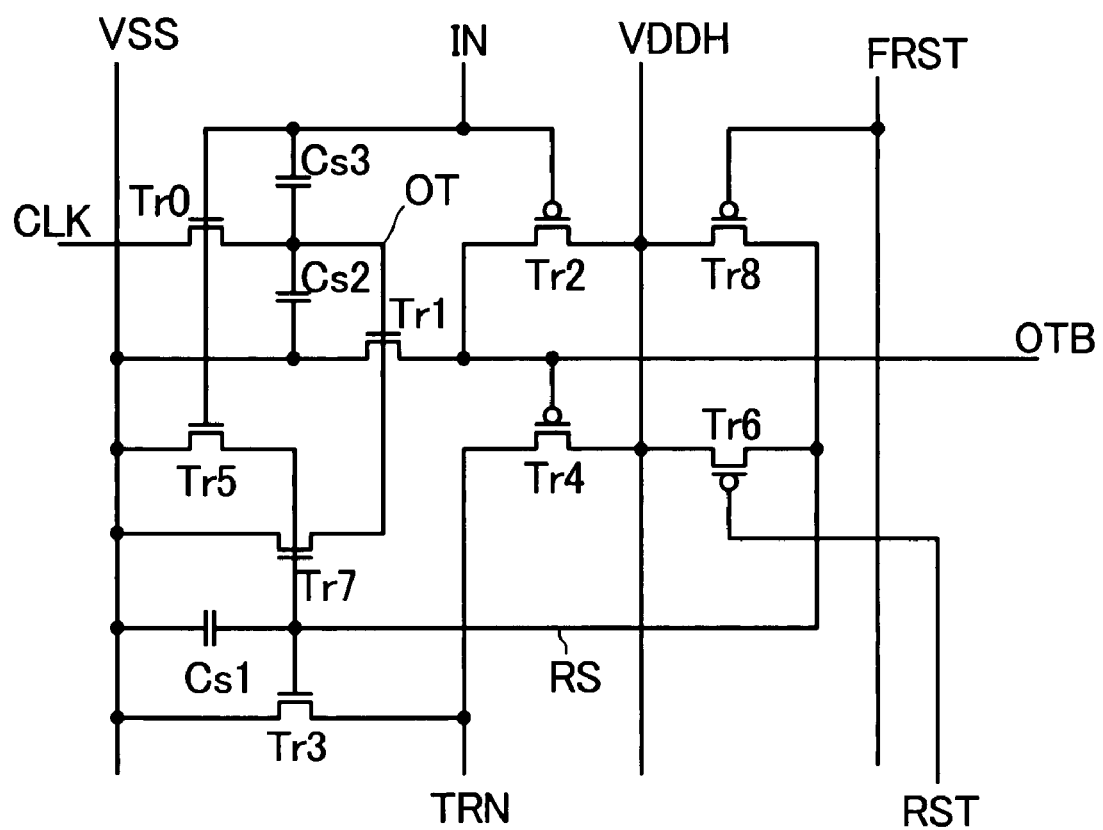
FIG. 7 is a circuit diagram showing a basic circuit which incorporates all modifications shown in FIG. 5 and FIG. 6.

FIG. 7 shows the circuit constitution of the basic circuit which is provided with the above-mentioned all functions.

The input node of the input signal (IN) of the final stage assumes the H level in a floating state until a reset clock is inputted to the reset signal (RST) of the preceding stage. Here, upon dropping of the potential of the input node of the input signal (IN) to a value equal to or below the threshold voltage of the transistor (Tr2) from the H level, a through current flows when the node (OT) assumes the H level.

To effectively cope with the above-mentioned situation, after latching the clock (CLK) in the final stage, the clock (CLK) is made to assume the L level or the holding capacitance is provided to the input node of the input signal (IN) of the final stage.

Figure 8:
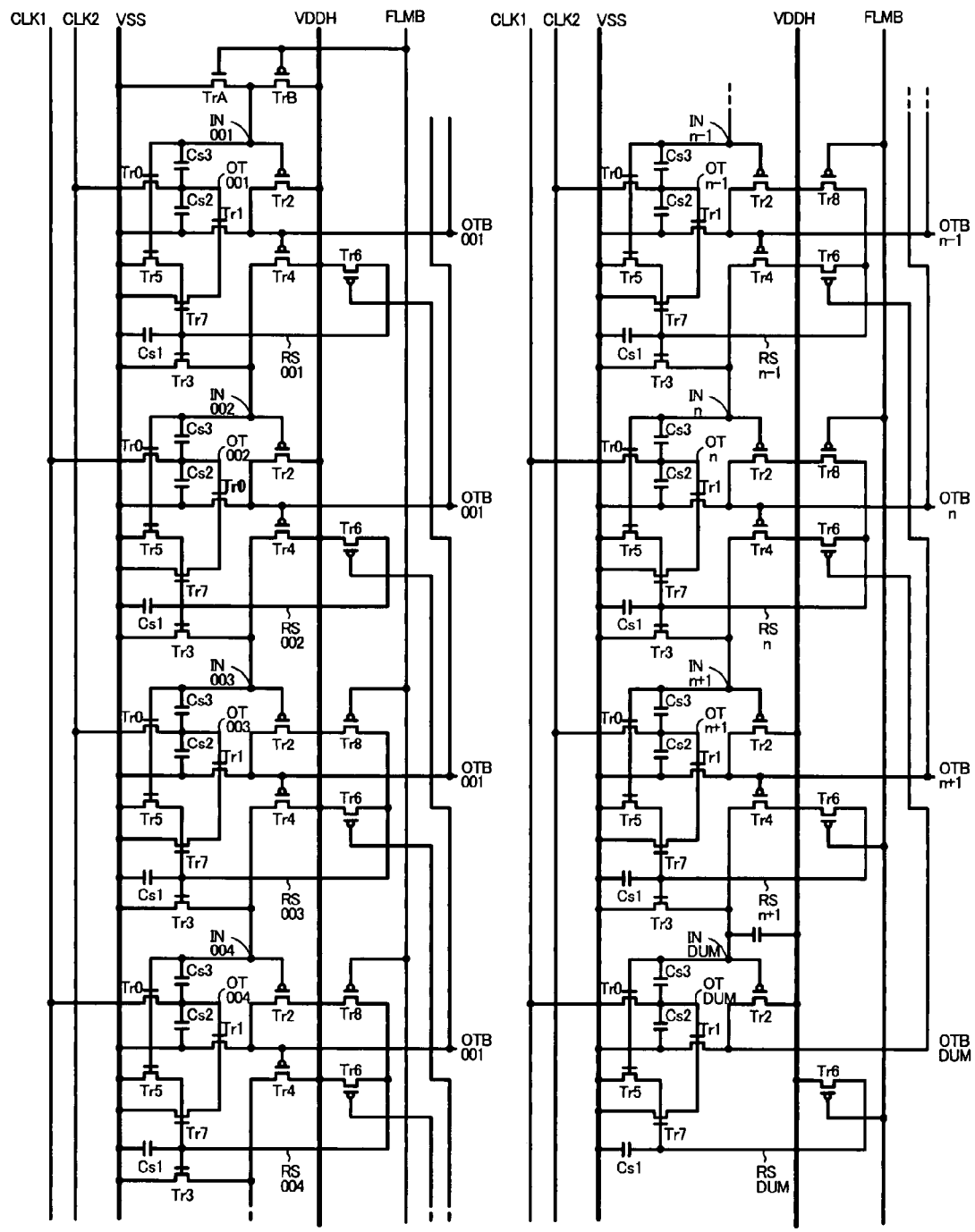
FIG. 8 is a circuit diagram showing the circuit constitution of the scanning circuit having all functions.
Figure 9:
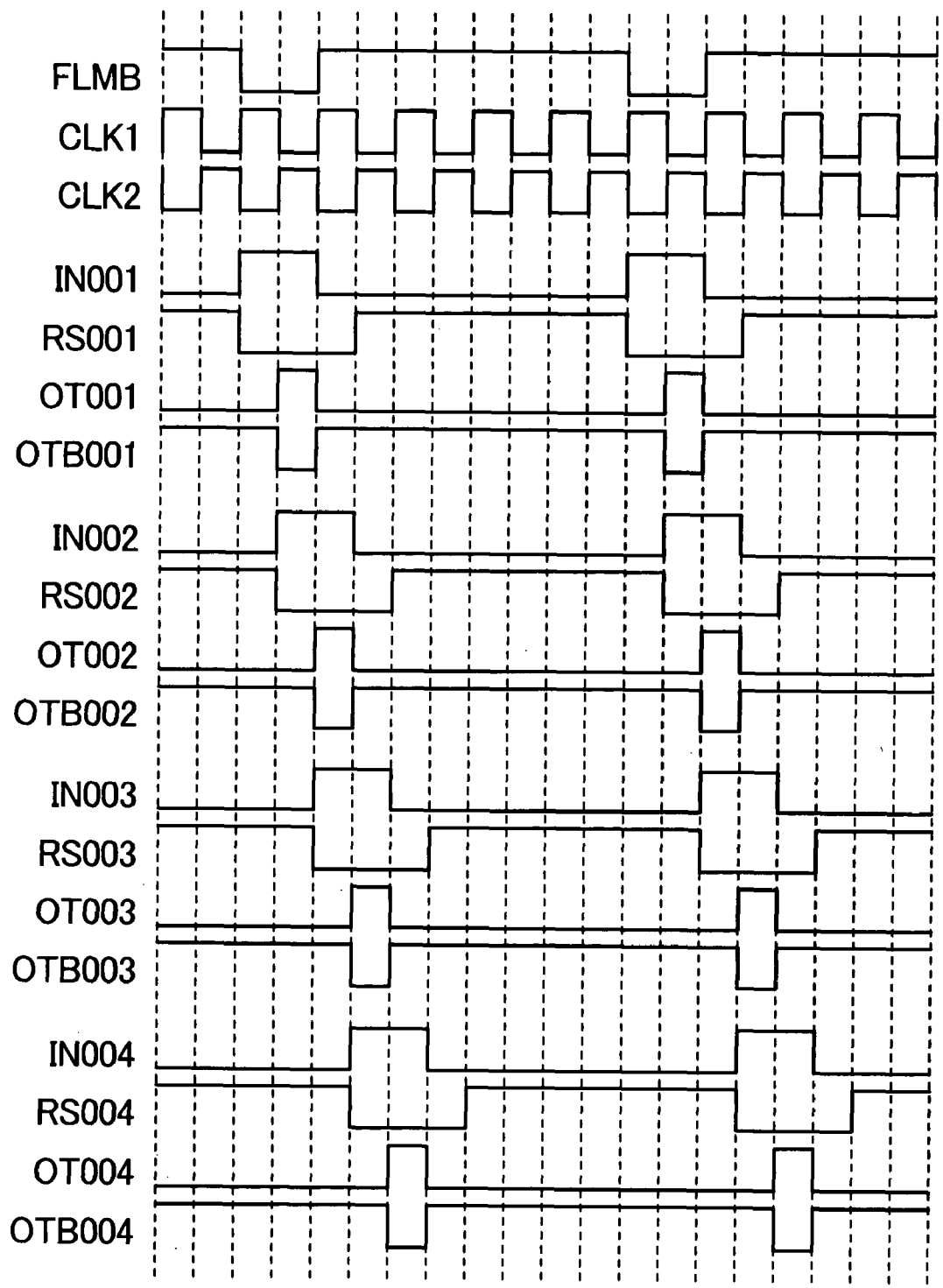
FIG. 9 is a view showing a timing chart of the scanning circuit shown in FIG. 8.

FIG. 8 shows the circuit constitution of the scanning circuit provided with the above-mentioned functions, and FIG. 9 is a timing chart of the scanning circuit.

Here, by replacing all n-type MOS transistors with the p-type MOS transistors, the p-type MOS transistors with the n-type MOS transistors and the second power source voltage (VDDH) with the first power source voltage (VSS), and further, by replacing the logic of the input signal, a scanning circuit which is operated with inverted logic is formed.

The scanning circuit shown in FIG. 4 is configured to output the clock (CLK) after boosting the H level of the clock (CLK) to a potential higher than the H level. When the logic is replaced as mentioned previously, the scanning circuit is configured to output the clock (CLK) after dropping the L level of the clock (CLK) to a further lower potential.

Figure 10:
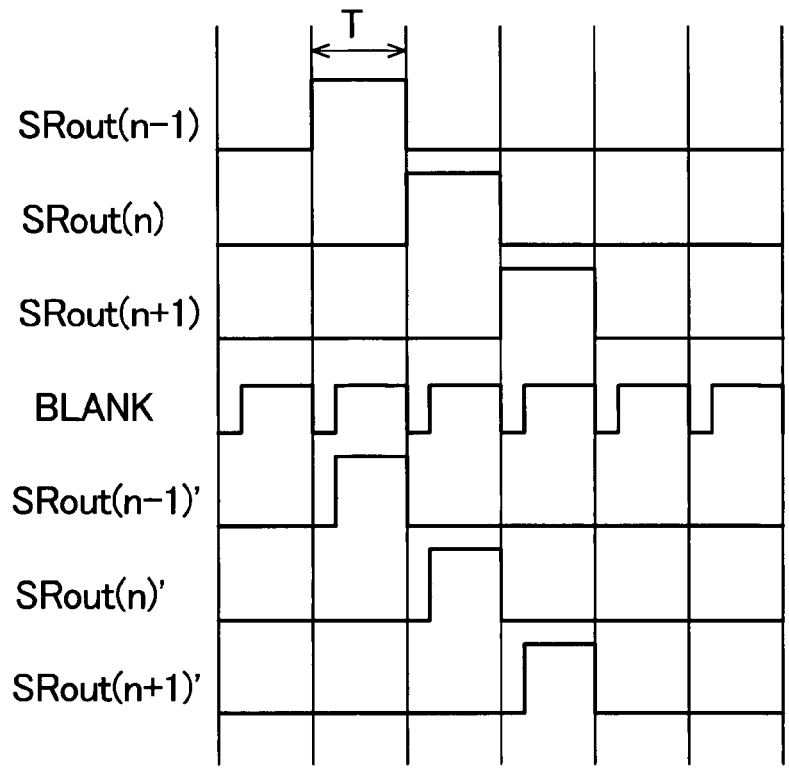
FIG. 10 is a view for explaining outputting timing of a CMOS shift register circuit in the embodiment of the present invention.

In the basic circuit of this embodiment shown in FIG. 2 and the basic circuit shown in FIG. 15, as indicated by SRout(n−1) to SRout(n+1) in FIG. 10, the rise and the fall in the outputting of the shift register circuit are performed at the same timing. However, in the actual circuit, the operational delay is generated thus giving rise to a possibility of the H level-H level.

Accordingly, with respect to the vertical scanning circuit (XDV) which uses the basic circuit of this embodiment shown in FIG. 2 or the basic circuit shown in FIG. 15, in the above-mentioned cases, two gate lines are instantaneously simultaneously selected thus affecting the potential which is already written in the pixel. Such a phenomenon is not desirable.

Usually, to prevent such a phenomenon, as in the case of the SRout(n−1)' to SRout(n+1)' in FIG. 10, a period of L level-L level may be provided to the output of the shift register circuit.

As the simple constitution for providing such a period, it is convenient to take a conjunction of the output of the shift register circuit (SRout) and a waveform correction clock such as BLANK shown in FIG. 10 (third clock of the present invention).

The waveform correction clock (BLANK) is a clock in which the L level period occupying in the inside of the output period (T in FIG. 10) of the shift register circuit is 50% or less.

Figure 11:
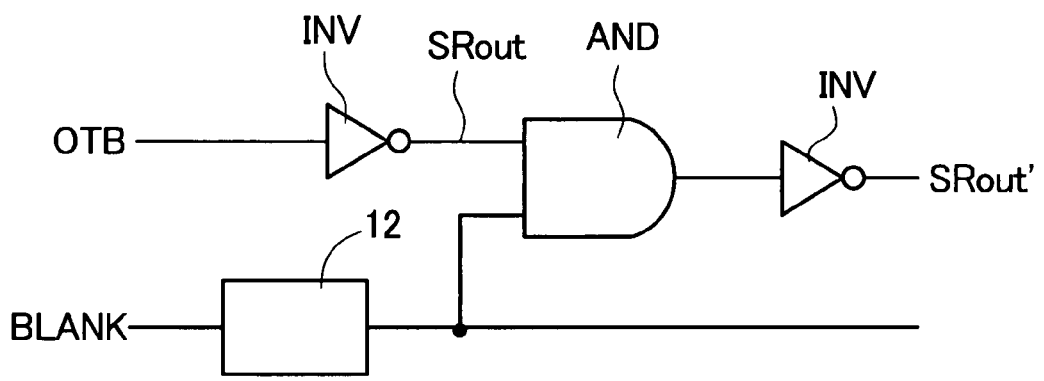
FIG. 11 is a circuit diagram showing the simple circuit constitution for providing a Low-level-Low-level period to an output of the CMOS shift register circuit in the embodiment of the present invention.

However, in the basic circuit of this embodiment, when amplitude of an output of the shift register circuit (SRout) is larger than amplitude of the waveform correction clock (BLANK), for example, when the waveform correction clock (BLANK) is 5 Vpp with respect to an output 10 Vpp of the shift register circuit, as shown in FIG. 11, it is necessary to provide a level shift circuit 12 and to perform level shifting of the waveform correction clock (BLANK).

Figure 12:
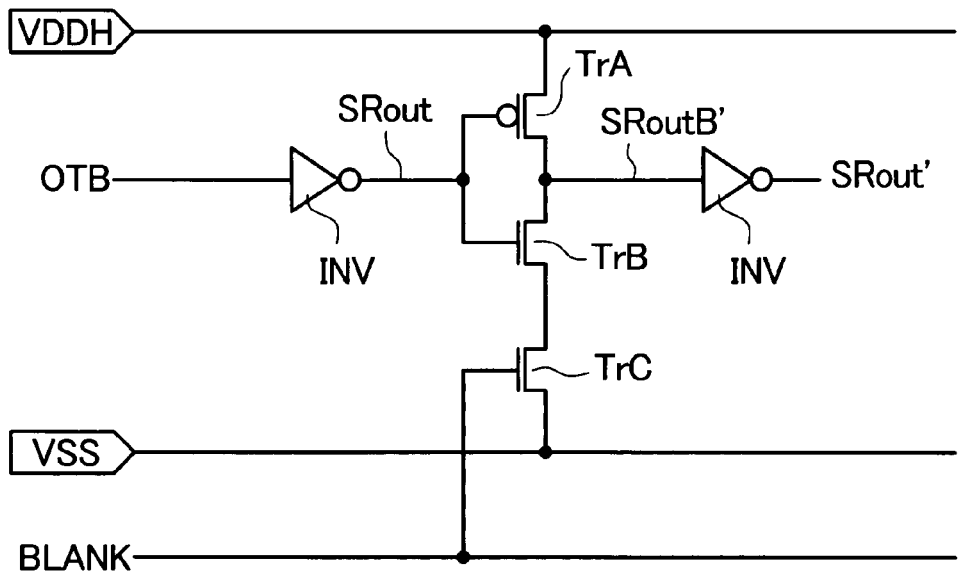
FIG. 12 is a circuit diagram showing another circuit constitution for providing the Low-level-Low-level period to the output of the CMOS shift register circuit in the embodiment of the present invention.

Here, as shown in FIG. 10, although it is limited to the case in which the period of L level-L level is provided, with the use of a circuit shown in FIG. 12, even when the amplitude of the output of the shift register circuit (SRout) is larger than the amplitude of the clock (CLK) as well as with the input amplitude of the low clock (CLK), it is possible to obtain an output of high amplitude with the L level-L level.

The circuit shown in FIG. 12 is configured by connecting in series the p-type MOS transistor (TrA), the n-type MOS transistor (TrB) and the n-type MOS transistor (TrC) between the second power source voltage (VDDH) and the first power source voltage (VSS). Here, the transistor (TrA) and the transistor (TrB) constitute a CMOS inverter, and the output of the shift register circuit (SRout) is applied to the CMOS inverter.

Further, the waveform correction clock (BLANK) is applied to the gate of the transistor (TrC). Here, in FIG. 11 and FIG. 12, symbol INV indicates an inverter.

Here, assuming the amplitude of the waveform correction clock (BLANK) as Vck3 and a potential difference between the second power source voltage (VDDH) and the first power source voltage (VSS) as Vh, it may be sufficient that relationships Vck3≧Vthn, Vh≧2×Vthn are satisfied. That is, the relationship Vck3<Vh can be obtained. Here, Vthn(>0) is a threshold voltage of the transistor (TrC).

In the circuit shown in FIG. 12, during a period in which the waveform correction clock (BLANK) assumes the L level, the node (SroutB') in FIG. 12 is held at the H level. As shown in FIG. 10, the rise of the output of the shift register circuit (SRout) and the fall of the waveform correction clock (BLANK) are performed at the same timing and hence, both of the transistors (TrB, TrC) shown in FIG. 12 are turned on together thus giving rise to the dropping of the holding level.

However, in an actual operation, the changeover timing of the output of the shift register circuit (SRout) which constitutes an inner circuit output is slightly delayed than the changeover timing of the waveform correction clock (BLANK) from the outside due to the operational delay of the inner circuit and hence, it is considered that no problem arises. However, it is possible to perform the changeover more safely by allowing the waveform correction clock (BLANK) to assume the L level prior to the output of the scanning circuit (SRout).

In this manner, the circuit shown in FIG. 12 can be, although application methods are limited, constituted of a small number of simple transistor elements and hence, as in the case of the circuit shown in FIG. 11, the clock of high amplitude is unnecessary where by the low power consumption can be achieved.

Further, in the circuit shown in FIG. 12, by replacing all n-type MOS transistors with the p-type MOS transistors and all p-type MOS transistors with the n-type MOS transistors, and by replacing the logic of the waveform correction clock (BLANK), it is possible to operate the display device based on an inverted logic.

Further, in the above-mentioned explanation, the explanation has been made with respect to the case in which the MOS (Metal Oxide Semiconductor)-type TFT is used as the transistor. However, the present invention can also use a MIS (Metal Insulator Semiconductor)-type TFT or the like.

Further, in the above-mentioned explanation, the explanation has been made with respect to the case in which the vertical drive circuit (XDV) and the horizontal drive circuit (YDV) are incorporated into the display panel (are integrally formed on a substrate of the display panel). However, the present invention is not limited to such formation, and the vertical drive circuit (XDV) per se, the horizontal drive circuit (YDV) per se, or a partial function of the circuit may be constituted by using a semiconductor chip.

Further, the above-mentioned explanation has been made with respect to the case in which the present invention is applied to the liquid crystal display device. However, it is needless to say that the present invention is not limited to the liquid crystal display device and is also applicable to an EL display device which uses an organic EL element, for example.

Although the invention made by inventors of the present invention has been specifically explained in conjunction with the above-mentioned embodiments, it is needless to say that the present invention is not limited to the above-mentioned embodiments and various modification are conceivable without departing from the gist of the present invention.

What is claimed is:

1. A display device comprising:
a plurality of pixels; and
a drive circuit which drives the plurality of pixels, wherein the drive circuit includes a shift register circuit,
the shift register circuit includes n(n≧2) pieces of basic circuits which are connected vertically in multiple stages,
the basic circuit includes
a first transistor of a first conductive type having a first electrode to which a clock is applied,
a second transistor of a second conductive type different from the first conductive type in a conductive type and having a first electrode to which a second power source voltage is applied; and
a third transistor of a first conductive type having a second electrode which is connected to the second electrode of the second transistor and a first electrode to which a first power source voltage different from the second power source voltage is applied;
wherein
the second electrode of the first transistor is connected to a control electrode of the third transistor,
an input signal is applied to a control electrode of the first transistor and a control electrode of the second transistor,
a voltage of the second electrode of the third transistor forms a scanning circuit output,
a fourth transistor of a second conductive type having a first electrode to which the second power source voltage is applied and a control electrode which is connected to a second electrode of the third transistor,
a fifth transistor of a first conductive type having a second electrode which is connected to a second electrode of the fourth transistor and a first electrode to which the first power source voltage is applied,
a sixth transistor of a second conductive type having a first electrode to which the second power source voltage is applied and a second electrode which is connected to a control electrode of the fifth transistor, and
a seventh transistor of a first conductive type having a second electrode which is connected to a second electrode of the sixth transistor and a first electrode to which the first power source voltage is applied, wherein
a voltage of a second electrode of the fifth transistor forms a transfer output,
a reset signal is applied to a control electrode of the sixth transistor, and the input signal is applied to a control electrode of the seventh transistor.

2. A display device according to claim 1, wherein the basic circuit includes an eighth transistor of a second conductive type having a first electrode to which the second power source voltage is applied and a second electrode which is connected to the second electrode of the sixth transistor, and
an inverted signal of a start signal is applied to a control electrode of the eighth transistor.

3. A display device according to claim 1, wherein the basic circuit includes a ninth transistor of a first conductive type having a first electrode to which the first power source voltage is applied, having a second electrode which is connected to the control electrode of the third transistor and a control electrode which is connected to a control electrode of the fifth transistor.

4. A display device according to claim 1, wherein the basic circuit includes a first capacitive element having one end which is connected to the control electrode of the fifth transistor and another end to which a predetermined voltage is applied.

5. A display device according to claim 1, wherein the basic circuit includes a second capacitive element having one end which is connected to the control electrode of the third transistor and another end to which a predetermined voltage is applied.

6. A display device according to claim 4, wherein the predetermined voltage is the first power source voltage or the second power source voltage.

7. A display device according to claim 1, wherein the basic circuit includes a third capacitive element which is connected between the control electrode of the first transistor and the second electrode of the first transistor.

8. A display device according to claim 1, wherein the basic circuit includes a buffer circuit which is connected to the second electrode of the third transistor, and an output of the buffer circuit forms the scanning circuit output.

9. A display device according to claim 8 wherein the buffer circuit is an inverter which is connected vertically.

10. A display device according to claim 1, wherein assuming amplitude of the clock as Vck and a potential difference between the first power source voltage and the second power source voltage as Vh, a relationship Vck<Vh is satisfied.

11. A display device according to claim 1, wherein assuming amplitude of the clock as Vck and an absolute value of the threshold voltage of the third transistor as |Vth|, a relationship Vck≧|Vth| is satisfied.

12. A display device according to claim 1, wherein out of the n pieces of basic circuits, a first clock is supplied to the first electrodes of the first transistors of the odd-numbered-stage basic circuits,
out of the n pieces of basic circuits, a second clock is supplied to the first electrodes of the first transistors of the even-numbered-stage basic circuits, and the first clock and the second clock have the same cycle and differ from each other in phase.

13. A display device according to claim 12, wherein out of the n pieces of basic circuits, the transfer output of an (m−1) stage basic circuit is inputted as the input signal of an m(2≦m≦n) stage basic circuit, and
the scanning circuit output of an (m+2) stage basic circuit is inputted as the reset signal of the m-stage basic circuit.

14. A display device according to claim 13, wherein out of the n pieces of basic circuits, a start signal is inputted as the input signal of a first-stage basic circuit.

15. A display device according to claim 12, wherein out of then pieces of basic circuits, an inverted signal of a start signal is inputted as the reset signals of (n−1) stage and n-stage basic circuits.

16. A display device according to claim 12, wherein out of the n pieces of basic circuits, the n-stage basic circuit is used as a dummy-stage basic circuit and does not contribute to a shift operation.

17. A display device according to claim 1, wherein the basic circuit includes:
- an eleventh transistor of a first conductive type having a first electrode to which the first power source voltage is applied;
- a twelfth transistor of a first conductive type having a first electrode which is connected to a second electrode of the eleventh transistor and a second electrode which is connected to an output terminal, and
- a thirteenth transistor of a second conductive type having a first electrode to which the second power source voltage is applied and a second electrode which is connected to the output terminal, wherein
- the scanning circuit output is applied to control electrodes of the twelfth transistor and the thirteenth transistor, and
- a third clock is applied to a control electrode of the eleventh transistor and
- a period in which the eleventh transistor is turned on in response to the third clock is within an output period of the scanning circuit output and is shorter than the output period of the scanning circuit output.

18. A display device according to claim 17, wherein assuming amplitude of the third clock as Vck3 and a potential difference between the first power source voltage and the second power source voltage as Vh, a relationship Vck3<Vh is satisfied.

19. A display device according to claim 17, wherein assuming amplitude of the third clock as Vck3 and an absolute value of the threshold voltage of the eleventh transistor as |Vth|, a relationship Vck3≧|Vth| is satisfied.

* * * * *